US012706161B2

(12) United States Patent
Bi et al.

(10) Patent No.: US 12,706,161 B2
(45) Date of Patent: Aug. 11, 2026

(54) MANAGING REFRESHMENT OF MEMORY CELLS IN MEMORY SYSTEMS

(71) Applicant: Yangtze Memory Technologies Co., Ltd., Wuhan (CN)

(72) Inventors: Fanya Bi, Wuhan (CN); Xing Wang, Wuhan (CN); Hua Tan, Wuhan (CN); Zhe Sun, Wuhan (CN); Bo Yu, Wuhan (CN); Guangyao Han, Wuhan (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 106 days.

(21) Appl. No.: 18/761,275

(22) Filed: Jul. 1, 2024

(65) Prior Publication Data

US 2025/0174285 A1 May 29, 2025

(30) Foreign Application Priority Data

Nov. 27, 2023 (CN) ......................... 202311607895.0

(51) Int. Cl.
*G11C 16/34* (2006.01)
*G11C 16/08* (2006.01)
*G11C 16/32* (2006.01)

(52) U.S. Cl.
CPC .......... *G11C 16/3427* (2013.01); *G11C 16/08* (2013.01); *G11C 16/32* (2013.01)

(58) Field of Classification Search
CPC ..... G11C 16/3427; G11C 16/08; G11C 16/32; G11C 13/0033; G11C 11/401; G11C 11/4085
See application file for complete search history.

(56) References Cited

U.S. PATENT DOCUMENTS 9,432,298 B1 * 8/2016 Smith ..................... H01L 25/18
2022/0382465 A1 * 12/2022 Maddah ................. G11C 16/32
2023/0072881 A1 * 3/2023 Xie ....................... G06F 3/0653

* cited by examiner

*Primary Examiner* — Mohammed A Bashar
(74) *Attorney, Agent, or Firm* — Fish & Richardson P.C.

(57) ABSTRACT

Systems, devices, methods, and storage media for managing refreshment of memory cells in memory systems are provided. In one aspect, a memory system includes: a non-volatile memory device including a plurality of memory cells and a memory controller coupled to the non-volatile memory device. The memory controller is configured to: refresh adjacent memory cells of a target memory cell of the plurality of memory cells, when a count of write operations performed on the target memory cell within a preset time duration is greater than a preset threshold.

20 Claims, 6 Drawing Sheets

| Electric distance | The first preset threshold |
| --- | --- |
| NN | 600 |
| MM | 800 |
| FF | 1000 |

MANAGING REFRESHMENT OF MEMORY CELLS IN MEMORY SYSTEMS

CROSS-REFERENCE TO RELATED APPLICATIONS

This application claims priority to Chinese Patent Application No. 202311607895.0, filed on Nov. 27, 2023, the disclosure of which is hereby incorporated by reference in its entirety.

TECHNICAL FIELD

The implementations of the present disclosure relate to the technical field of semiconductors, in particular to a memory system and an operating method thereof, an electronic device and a storage medium.

BACKGROUND

A non-volatile memory device is a storage device for storing information in modern information technology. The flash memory, as a typical non-volatile semiconductor memory, has the advantages of high storage density, controllable production cost, suitable programming and erasing speed and preservation characteristics, and has gradually become the mainstream product in the memory market.

Memory systems such as solid state drive (SSD) for personal computers and servers and universal flash storage (UFS) for mobile phones and various embedded systems usually use flash memory as their permanent storage medium. Therefore, how to further improve the performance of memory system has become an urgent problem to be solved in the industry.

SUMMARY

In light of this, the implementations of the present disclosure provide a memory system and an operating method thereof, an electronic device and a storage medium. The memory system comprises: a non-volatile memory device including a plurality of memory cells, wherein the plurality of memory cells include a target memory cell; and a memory controller coupled to the non-volatile memory device and configured to: refresh adjacent memory cells of the target memory cell when a count of write operations performed on the target memory cell within a preset time duration is greater than a preset threshold.

In some implementations, the memory controller is configured to: obtain the count of write operations performed on the target memory cell within the preset time duration and the preset threshold; wherein different preset time durations correspond to different preset thresholds.

In some implementations, a first preset time duration corresponds to a first preset threshold; and the memory controller is further configured to: refresh the adjacent memory cells of the target memory cell, when a count of write operations performed on the target memory cell within the first preset time duration is greater than the first preset threshold.

In some implementations, a second preset time duration corresponds to a second preset threshold; and the second preset time duration is longer than the first preset time duration; a ratio between the first preset threshold and the first preset time duration is a first ratio, a ratio between the second preset threshold and the second preset time duration is a second ratio, and the first ratio is greater than the second ratio; the memory controller is further configured to: obtain a count of write operations performed on the target memory cell within the second preset time duration and the second preset threshold, when the count of write operations performed on the target memory cell within the first preset time duration is less than or equal to the first preset threshold; wherein the adjacent memory cells of the target memory cell are refreshed, when the count of write operations performed on the target memory cell within the second preset time duration is greater than the second preset threshold.

In some implementations, a third preset time duration corresponds to a third preset threshold; and the third preset time duration is longer than the second preset time duration; a ratio between the third preset threshold and the third preset time duration is a third ratio, and the second ratio is greater than the third ratio; the memory controller is further configured to: obtain a count of write operations performed on the target memory cell within the third preset time duration and the third preset threshold, when the count of write operations performed on the target memory cell within the second preset time duration is less than or equal to the second preset threshold; wherein the adjacent memory cells of the target memory cell are refreshed, when the count of write operations performed on the target memory cell within the third preset time duration is greater than the third preset threshold.

In some implementations, the non-volatile memory device further comprises a plurality of word lines and a plurality of bit lines; the plurality of memory cells are coupled with the plurality of word lines and the plurality of bit lines, each of the word lines and each of the bit lines is connected to an address line driver through a respective address line contact; the memory controller is further configured to: determine the first preset threshold corresponding to the first preset time duration, according to a distance between the target memory cell and the address line contact of at least one of the word line or the bit line where the target memory cell is located.

In some implementations, the memory controller is configured to: determine the first preset threshold to be a first value, when the distance between the target memory cell and the address line contact of at least one of the word line or the bit line where the target memory cell is located is a first distance; determine the first preset threshold to be a second value, when the distance between the target memory cell and the address line contact of at least one of the word line or the bit line where the target memory cell is located is a second distance; and determine the first preset threshold to be a third value, when the distance between the target memory cell and the address line contact of at least one of the word line or the bit line where the target memory cell is located is a third distance; wherein the first distance is less than the second distance, and the second distance is less than the third distance; the first value is less than the second value, and the second value is less than the third value.

In some implementations, the memory controller is further configured to: obtain the count of write operations performed on the target memory cell within the preset time duration through a Bloom filter and/or a time pyramid filter.

In some implementations, the memory controller is further configured to: clear the count of write operations performed on the target memory cell within the preset time duration after refreshing the adjacent memory cells of the target memory cell.

In some implementations, the non-volatile memory device further comprises a plurality of word lines and a plurality of bit lines; the plurality of memory cells are coupled with the plurality of word lines and the plurality of bit lines; the memory controller is further configured to: refresh memory cells disposed adjacent to the target memory cell along a direction in which the word lines extend and/or memory cells disposed adjacent to the target memory cell along a direction in which the bit lines extend.

In some implementations, the memory system comprises a storage level memory system and the non-volatile memory device comprises a phase change memory.

The implementations of the present disclosure further provide an electronic device comprising a host system and a memory system coupled to the host system, wherein: the memory system includes a non-volatile memory device and a memory controller coupled to the non-volatile memory device; the non-volatile memory device includes a plurality of memory cells, wherein the plurality of memory cells include a target memory cell; the host system is configured to store a count of write operations performed on the target memory cell in a filter of the host system during performing the write operations on the target memory cell; and the memory controller is configured to: obtain, from the filter, a count of write operations performed on the target memory cell within a preset time duration, and compare the count of write operations with a preset threshold; and refresh adjacent memory cells of the target memory cell, when the count of write operations is greater than the preset threshold.

The implementations of the present disclosure provide an operating method for a memory system, wherein the memory system comprises a non-volatile memory device and a memory controller coupled with the non-volatile memory device; the non-volatile memory device includes a plurality of memory cells, wherein the plurality of memory cells include a target memory cell; the operating method comprising: comparing a count of write operations performed on the target memory cell within a preset time duration with a preset threshold; and refreshing adjacent memory cells of the target memory cell, when the count of write operations performed on the target memory cell within a preset time duration is greater than the preset threshold.

In some implementations, the operating method further comprises: obtaining, before performing the comparison, the count of write operations performed on the target memory cell within the preset time duration and the preset threshold; wherein depending on different preset time durations, the corresponding preset thresholds are different.

In some implementations, a first preset time duration corresponds to a first preset threshold; and wherein refreshing adjacent memory cells of the target memory cell, when the count of write operations performed on the target memory cell within the preset time duration is greater than the preset threshold comprises: refreshing the adjacent memory cells of the target memory cell, when a count of write operations performed on the target memory cell within the first preset time duration is greater than the first preset threshold.

In some implementations, a second preset time duration corresponds to a second preset threshold; and the second preset time duration is longer than the first preset time duration; a ratio between the first preset threshold and the first preset time duration is a first ratio, a ratio between the second preset threshold and the second preset time duration is a second ratio, and the first ratio is greater than the second ratio; the operating method further comprises: obtaining a count of write operations performed on the target memory cell within the second preset time duration and the second preset threshold, when the count of write operations performed on the target memory cell within the first preset time duration is less than or equal to the first preset threshold; comparing the count of write operations performed on the target memory cell within the second preset time duration with the second preset threshold; and refreshing the adjacent memory cells of the target memory cell, when the count of write operations performed on the target memory cell within the second preset time duration is greater than the second preset threshold.

In some implementations, a third preset time duration corresponds to a third preset threshold; and the third preset time duration is longer than the second preset time duration; a ratio between the third preset threshold and the third preset time duration is a third ratio, and the second ratio is greater than the third ratio; the operating method further comprises: obtaining a count of write operations performed on the target memory cell within the third preset time duration and the third preset threshold, when the count of write operations performed on the target memory cell within the second preset time duration is less than or equal to the second preset threshold; comparing the count of write operations performed on the target memory cell within the third preset time duration with the third preset threshold; and refreshing the adjacent memory cells of the target memory cell, when the count of write operations performed on the target memory cell within the third preset time duration is greater than the third preset threshold.

In some implementations, the non-volatile memory device further comprises a plurality of word lines and a plurality of bit lines; the plurality of memory cells are coupled with the plurality of word lines and the plurality of bit lines, each of the word lines and each of the bit lines is connected to an address line driver through a respective address line contact; the operating method further comprises: determining the first preset threshold corresponding to the first preset time duration, according to a distance between the target memory cell and the address line contact of at least one of the word line or the bit line where the target memory cell is located.

In some implementations, determining the first preset threshold corresponding to the first preset time duration, according to a distance between the target memory cell and the address line contact of at least one of the word line or the bit line where the target memory cell is located comprises: determining the first preset threshold to be a first value, when the distance between the target memory cell and the address line contact of at least one of the word line or the bit line where the target memory cell is located is a first distance; determining the first preset threshold to be a second value, when the distance between the target memory cell and the address line contact of at least one of the word line or the bit line where the target memory cell is located is a second distance; and determining the first preset threshold to be a third value, when the distance between the target memory cell and the address line contact of at least one of the word line or the bit line where the target memory cell is located is a third distance; wherein the first distance is less than the second distance, and the second distance is less than the third distance; the first value is less than the second value, and the second value is less than the third value.

In some implementations, the operating method further comprises: obtaining the count of write operations performed on the target memory cell within the preset time duration through a Bloom filter and/or a time pyramid filter.

In some implementations, the operating method further comprises: clearing the count of write operations performed on the target memory cell within the preset time duration after refreshing the adjacent memory cells of the target memory cell.

In some implementations, the non-volatile memory device further comprises a plurality of word lines and a plurality of bit lines; the plurality of memory cells are coupled with the plurality of word lines and the plurality of bit lines; the operating method further comprising: refreshing memory cells disposed adjacent to the target memory cell along a direction in which the word lines extend and/or memory cells disposed adjacent to the target memory cell along a direction in which the bit lines extend.

The implementations of the present disclosure further provide a storage medium having executable instructions stored thereon, which when executed by a memory controller, implement the operations of the method of the above implementations of the present disclosure.

The implementations of present disclosure provide a memory system and an operating method thereof, an electric device and a storage medium. The memory system comprises: a non-volatile memory device including a plurality of memory cells, wherein the plurality of memory cells include a target memory cell; and a memory controller coupled to the non-volatile memory device and configured to: refresh adjacent memory cells of the target memory cell, when a count of write operations performed on the target memory cell within a preset time duration is greater than a preset threshold. In the implementations of the present disclosure, the count of writing performed on the target memory cell within the preset time duration is counted, and the adjacent memory cells of the target memory cell are refreshed when the count of writing within a preset time duration is greater than a preset threshold. In this way, the write interference to adjacent memory cells of the target memory cell caused by frequently performing the write operations may be reduced. Moreover, access performance of the memory system may be improved by monitoring the count of writing for the target memory cell and filtering out the memory cells damaged by frequent writing and reading during refreshing the adjacent memory cells.

DETAILED DESCRIPTION

Figure 1:
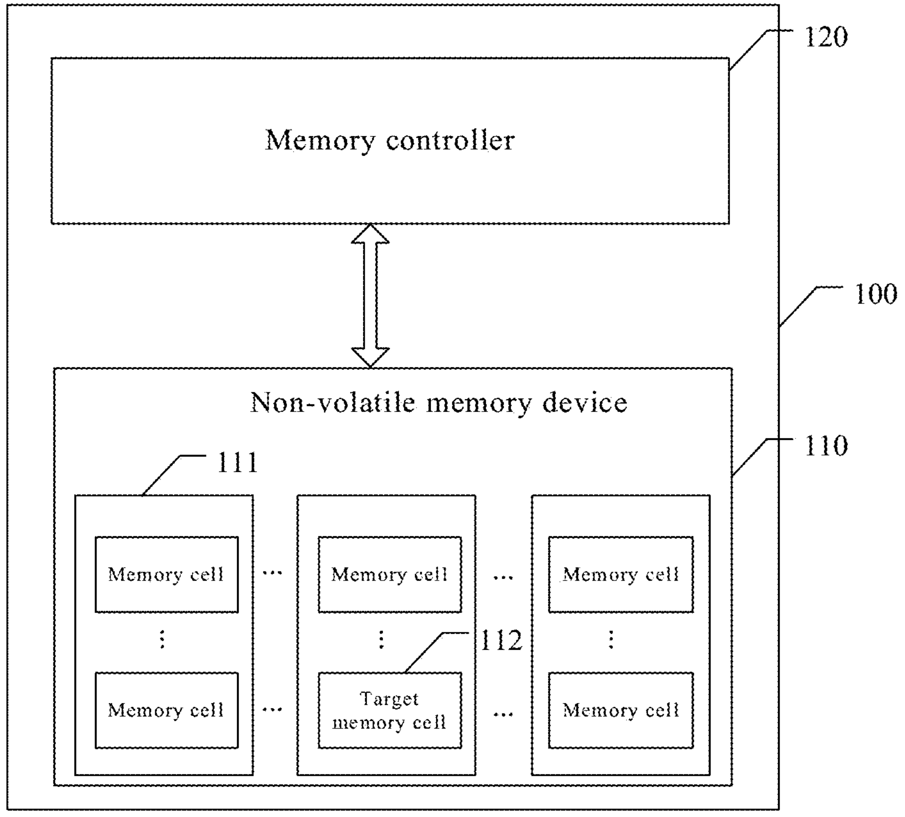
FIG. 1 is a block diagram of a memory system provided by an implementation of the present disclosure.

Exemplary implementations of the present disclosure will be described in more detail below with reference to the drawings. Although exemplary implementations of the present disclosure are shown in the drawings, it should be understood that the present disclosure may be implemented in various forms and should not be limited by the specific implementations set forth herein. Rather, these implementations are provided to enable a more thorough understanding of the disclosure and to fully convey the scope of the disclosure to those skilled in the art.

A great deal of specific details is given in the following description to provide a more thorough understanding of the disclosure. However, it will be apparent to those skilled in the art that the present disclosure may be practiced without one or more of these details. Some technical features well known in the art are not described in other examples to avoid confusion with the present disclosure. That is, not all the features of the actual implementations are described herein, and the well-known functions and structures are not described in detail. In the drawings, the size and relative size of layer, zone, and element may be exaggerated for clarity. The same reference number may denote the identical elements throughout the drawings.

It should be understood that when an element or layer is referred to as "on", "adjacent to", "connected to" or "coupled to" another element or layer, it may be directly on, adjacent to, connected to or coupled to another element or layer, or may have an intervening element or layer there between. Conversely, when an element is described as "directly on", "directly adjacent to", "directly connected to" or "directly coupled to" another element or layer, there are no intervening elements or layers there between. It should be understood that although the terms "first", "second", "third", etc. may be used to describe various elements, components, zones, layers and/or portions, these elements, components, zones, layers and/or portions should not be limited by these terms. These terms are used only to distinguish one element, component, zone, layers and/or portion from another element, component, zone, layer and/or portion. Thus the first element, component, zone, layer and/or portion discussed below may be represented as the second element, component, zone, layer and/or portion without departing from the teachings of the present disclosure. While the discussion of a second element, component, zone, layer and/or portion does not imply that the first element, component, zone, layer and/or portion must exist.

The spatial relationship terms such as "under", "below", "the below", "down", "on", "above", etc. may be used herein for ease of description, and thereby used to describe the relationship of one element or feature shown in the drawings with other elements or features. It should be appreciated that, in addition to the orientations shown in the drawings, the spatial relationship terms may be intended to include different orientations of the device in use and operation. For example, if the device in the drawings is turned over, then the element or feature described as "under" or "below" other elements can be oriented to be "on" the other elements or features. Thus, the exemplary terms "under" and "below" may include both up and down orientations. The device may be oriented in other ways (rotated 90 degrees or in other orientations) and the spatial description terms used herein are interpreted accordingly.

The terms used herein is for the purpose of describing specific implementations only and is not a limitation of the present disclosure. When used herein, the singular forms "a", "an", and "the/that" can also be intended to include the plural forms, unless the context clearly indicates otherwise. It should be appreciated that, the terms "comprising" and/or "including", when used in this specification, can identify the presence of the features, integers, steps, operations, components and/or parts, but do not exclude the presence of one or more other features, integers, steps, operations, components, and/or parts and/or components and/or groups. When used herein, the term "and/or" may include any and all combinations of the relevant listed items.

In order to enable a more detailed understanding of the features and technical contents of the implementations of the present disclosure, the enabling of the implementations of the present disclosure will be described in detail below in conjunction with the drawings, which are provided for illustration only and are not intended to limit the implementations of the present disclosure.

The new types of non-volatile memory represented by flash, phase change memory (PCM), resistive random access memory (RRAM), ferroelectric random access memory (FRAM), magnetoresistive random access memory (MRAM) and nantero's CNT random access memory (NRAM) have the advantages of fast access speed, low energy consumption and non-volatile storage, thus the non-volatile memory is used more and more broadly.

Taking PCM as an example, the basic principle of PCM is that an electrical pulse with large signal value and short duration (i.e., high and narrow) is applied to a phase change memory cell. Under the effect of Joule heat, a part of an initial crystalline phase change memory layer melts because the temperature is higher than a melting temperature. After the electrical pulse is cut off, the melted part cools rapidly and stays in an amorphous state with low atomic order, thus completing the conversion from low resistance to high resistance, which is called a reset process. This melted part is called programming volume. If an electrical pulse with small signal value and long duration (i.e., low and wide) is applied, so that the temperature in the programming volume is above a crystallization temperature and below the melting temperature, and the duration is long enough to crystallize the amorphous structure in the programming volume, the low resistivity state is obtained, which is called a write (set) process. The read of PCM is to apply a low and narrow electrical pulse to the phase change memory cell, so that the temperature of phase change memory layer is below the crystallization temperature, and then the resistance of the phase change memory cell may be measured.

However, in practice, accessing (e.g. write, read) the same memory cell in high frequency may seriously interfere with memory cells adjacent (in terms of physical location) to the accessed memory cell, and even affect other memory cells connected to the same word line (WL) or bit line (BL). In order to avoid the failure of the whole PCM due to the interference on adjacent memory cells of a certain accessed memory cell, wear leveling is usually used to evenly distribute writes to different memory cells. However, it is difficult to track write interference at the system level due to the need to monitor all memory cells for a wide range and a long time. In other words, it is very difficult to track all count of writing for each memory cell in a long time interval. In view of this, how to enable the monitoring on the write interference and the follow-up operations is the key to improve the access performance of PCM.

In view of this, the implementations of the present disclosure provide a memory system and an operating method thereof, an electronic device and a storage medium. The implementations of the present disclosure provide an operating method for a memory system, as shown in FIG. 1. The FIG. 1 is a block diagram of a memory system provided by an implementation of the present disclosure. The memory system 100 comprises a non-volatile memory device 110 and a memory controller 120 coupled to the non-volatile memory device 110. The non-volatile memory device 110 may include a plurality of memory blocks 111 (also called as physical blocks). Each memory block may include a plurality of memory cells, the plurality of memory cells include a target memory cell 112. The target memory cell 112 may be any one or more of the plurality of memory blocks. In an implementation of present disclosure, the target memory cell is the memory cell which is accessed frequently in the plurality of memory cells.

Figure 2:
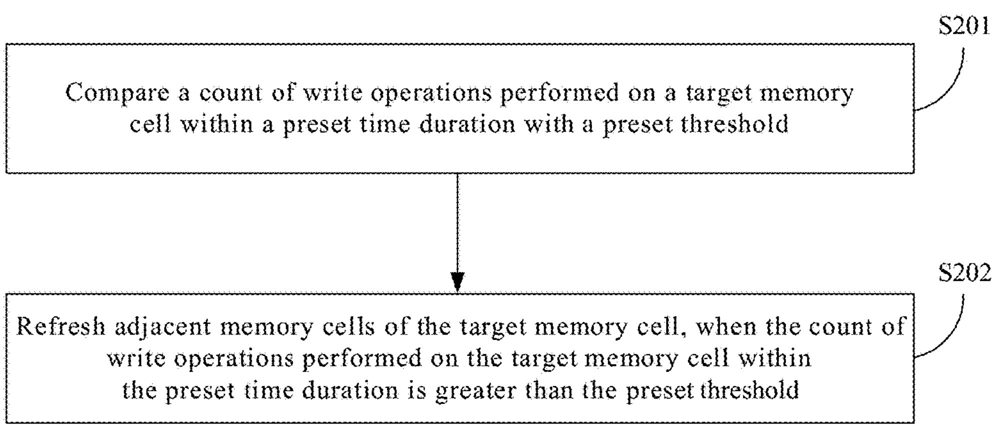
FIG. 2 is a schematic flow diagram for implementing an operating method for a memory system provided by an implementation of the present disclosure.

As shown in FIG. 2, which is a schematic flow diagram for implementing an operating method for a memory system provided by an implementation of the present disclosure, the operating method comprises the following operations: Operation S201: comparing a count of write operations performed on a target memory cell within a preset time duration with a preset threshold; Operation S202: refreshing adjacent memory cells of the target memory cell when the count of write operations performed on the target memory cell within the preset time duration is greater than the preset threshold.

That is, in the implementations of the present disclosure, the count of write operations performed on the target memory cell is monitored and tracked. The influence of the writing interference resulted by the write operations on the target memory cell and its adjacent memory cells as well as the degree of the influence are determined by determining whether the count of write operations performed on the target memory cell within a preset time duration exceeds a preset threshold. Further, it is determined whether to perform subsequent operations, such as refresh, collection or the like, on the target memory cell and its adjacent memory cells.

In some implementations, the operating method further comprises: obtaining, before performing the comparison, the count of write operations performed on the target memory cell within the preset time duration and the preset threshold; wherein depending on different preset time durations, the corresponding preset thresholds are different.

In some specific implementations, a plurality of values may be set for the preset time duration, and the preset threshold may have a plurality of values accordingly, in order to facilitate determining whether the count of write operations performed by the target memory cell within different preset time durations (e.g. short, long) is greater than a certain preset threshold. In an implementation of the present disclosure, the preset time duration may include three time durations, such as a first preset time duration S1, a second preset time duration S2 and a third preset time duration S3, wherein the third preset time duration S3 is longer than the second preset time duration S2, and the second preset time duration S2 is longer than the first preset time duration S1, i.e, S3>S2>S1. Each time duration corresponds to different preset thresholds, and in view of this, the preset threshold may include three different thresholds, such as a first preset threshold R1, a second preset threshold R2 and a third preset threshold R3, wherein the third preset threshold R3 is larger than the second preset threshold R2, and the second preset threshold R2 is larger than the first preset threshold R1, i.e., R3>R2>R1. Here, the first preset time duration S1 corresponds to the first preset threshold R1, the second preset time duration S2 corresponds to the second preset threshold R2, and the third preset time duration S3 corresponds to the third preset threshold R3.

In some implementations, a ratio between the first preset threshold R1 and the first preset time duration S1 is a first ratio L1, a ratio between the second preset threshold R2 and the second preset time duration S2 is a second ratio L2, and a ratio between the third preset threshold R3 and the third preset time duration S3 is a third ratio L3. Here, the first ratio L1 is greater than the second ratio L2, and the second ratio L2 is greater than the third ratio L3, i.e., L1>L2>L3. It should be understood that the first ratio L1, the second ratio L2 and the third ratio L3 respectively characterize writing density within different time durations, and the writing density is different if the preset time duration is different. Wherein, the writing density within the first preset time duration S1 is greater than that within the second preset time duration S2, and the writing density within the second preset time duration S2 is greater than that within the third preset time duration S3.

As an example, the count WC1 of write operations performed on the target memory cell within the first preset time duration and the corresponding first preset threshold R1 are obtained, and then the count WC1 of write operations within the first preset time duration is compared with the first preset threshold R1. When the count WC1 of write operations performed on the target memory cell within the first preset time duration is larger than the first preset threshold R1, it indicates that the count of write operations within the first preset time duration is large, thus the resulted write interference may affect the adjacent memory cells of the target memory cell severely. In this case, the adjacent memory cells of the target memory cell may be refreshed. When the count WC1 of write operations performed on the target memory cell within the first preset time duration S1 is less than or equal to the first preset threshold R1, it indicates that the count of write operations within the first preset time duration is small, thus the resulted write interference has less influence on the adjacent memory cells of the target memory cell. In this case, the adjacent memory cells of the target memory cell may not be refreshed for this moment, further, the count WC2 of write operations performed on the target memory cell within the second preset time duration S2 and the second preset threshold R2 are obtained.

As an example, after the count WC2 of write operations performed on the target memory cell within the second preset time duration and the corresponding second preset threshold R2 are obtained, the count WC2 of write operations within the second preset time duration is compared with the second preset threshold R2. Similarly, when the count WC2 of write operations performed on the target memory cell within the second preset time duration is larger than the second preset threshold R2, the adjacent memory cells of the target memory cell may be refreshed. When the count WC2 of write operations performed on the target memory cell within the second preset time duration S2 is less than or equal to the second preset threshold R2, the adjacent memory cells of the target memory cell may not be refreshed for this moment, further, the count WC3 of write operations performed on the target memory cell within the third preset time duration S3 and the third preset threshold R3 are obtained.

As an example, after the count WC3 of write operations performed on the target memory cell within the third preset time duration and the corresponding third preset threshold R3 are obtained, the count WC3 of write operations within the third preset time duration is compared with the third preset threshold R3. Similarly, when the count WC3 of write operations performed on the target memory cell within the third preset time duration S3 is larger than the third preset threshold R3, the adjacent memory cells of the target memory cell may be refreshed. When the count WC3 of write operations performed on the target memory cell within the third preset time duration S3 is less than or equal to the third preset threshold R3, the adjacent memory cells of the target memory cell may not be refreshed for this moment.

In some implementations, the first preset time duration may be 10 milliseconds to 50 seconds, the second preset time duration may be 100 to 1000 seconds, and the third preset time duration may be 5000 to 20000 seconds or more. The first preset threshold R1, the second preset threshold R2 and the third preset threshold R3 may be set according to different preset time duration. As an example, the first preset time duration may be 1 s, the second preset time duration may be 100 s, and the third preset time duration may be 10,000 s. The first preset threshold R1, the second preset threshold R2 and the third preset threshold R3 may have empirical values set according to the degree of the accessed memory cells actually affected. As an example, the first preset threshold R1 may be 600 to 1000, the second preset threshold R2 may be 5,000, and the third preset threshold R3 may be 50,000. The adjacent memory cells of the target memory cell may be refreshed when the count WC1 of write operations performed on the target memory cell within 1 s is greater than 600 (~1000). The adjacent memory cells of the target memory cell may be refreshed when the count WC2 of write operations performed on the target memory cell within 100 s is greater than 5,000. The adjacent memory cells of the target memory cell may be refreshed when the count WC3 of write operations performed on the target memory cell within 10,000 s is greater than 50,000.

In some implementations, the operating method further comprises: clearing the count of write operations performed on the target memory cell within the preset time duration after refreshing the adjacent memory cells of the target memory cell. Therefore, the interference of the previous counting information to the subsequent counting may be avoided.

In some specific implementations, the count of write operations performed on the target memory cell within different preset time durations may be obtained through a Bloom filter and/or a time pyramid filter.

Figure 3:
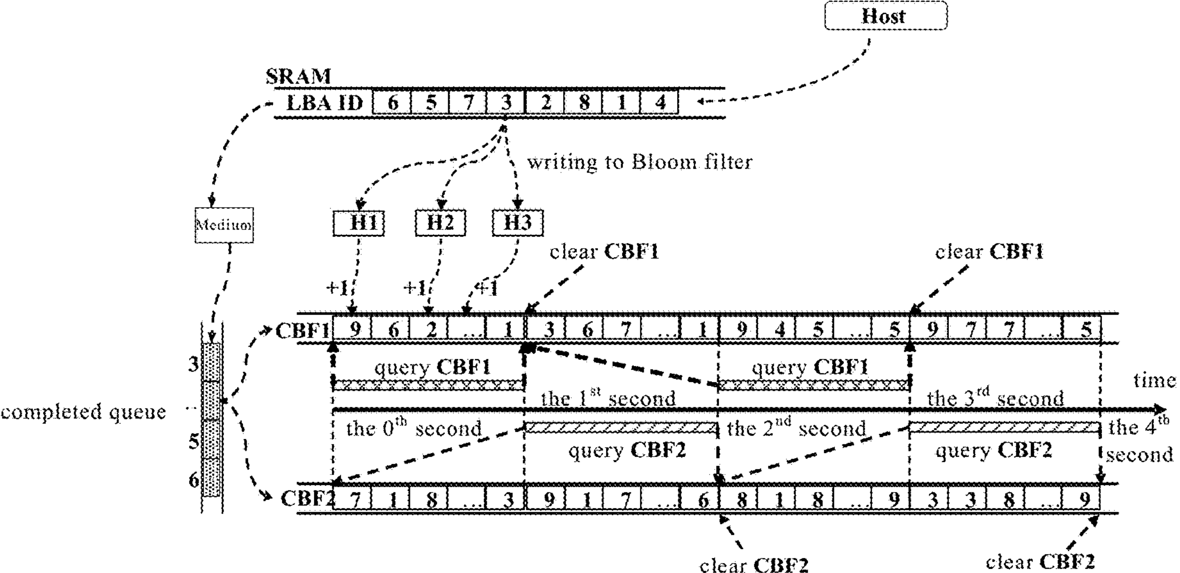
FIG. 3 is a schematic diagram of counting process by a Bloom filter provided by an implementation of the present disclosure.
Figure 4:
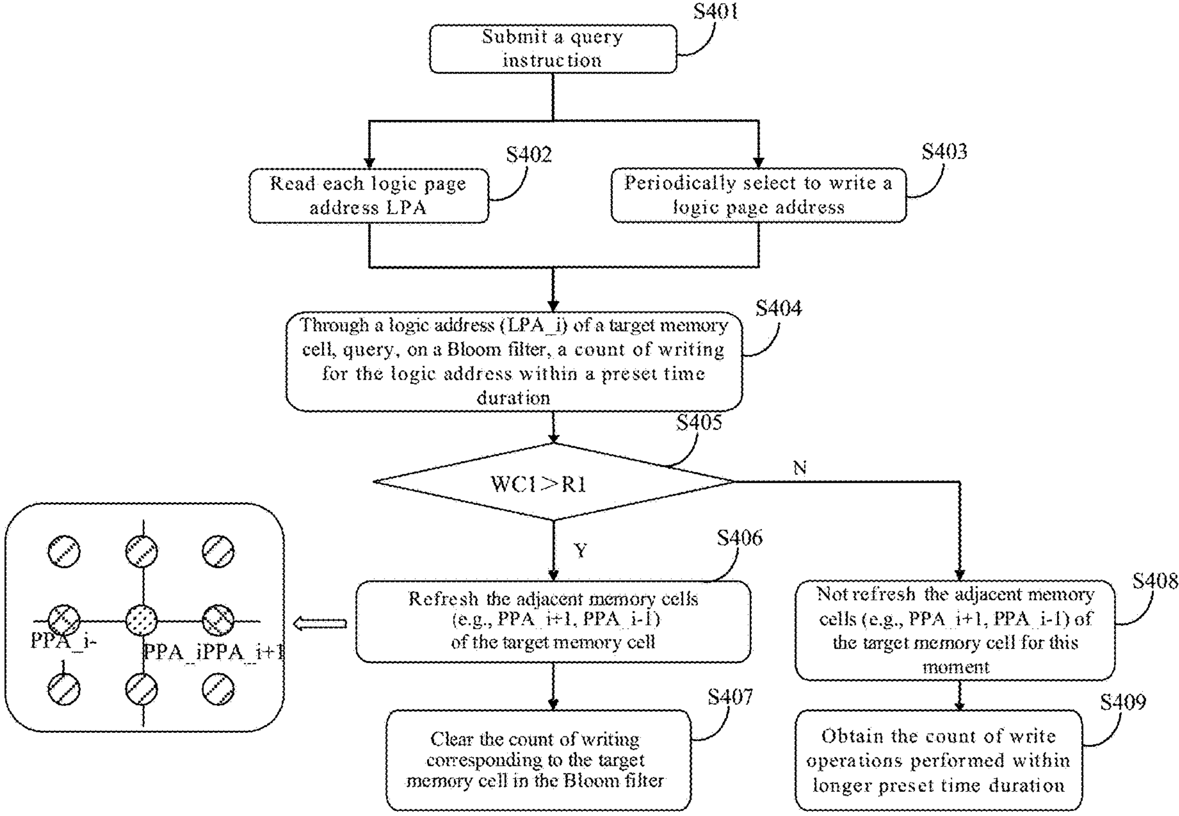
FIG. 4 is a schematic flow diagram of counting by a Bloom filter and determining whether to refresh adjacent memory cells provided by an implementation of the present disclosure.
Figures 5, 6:
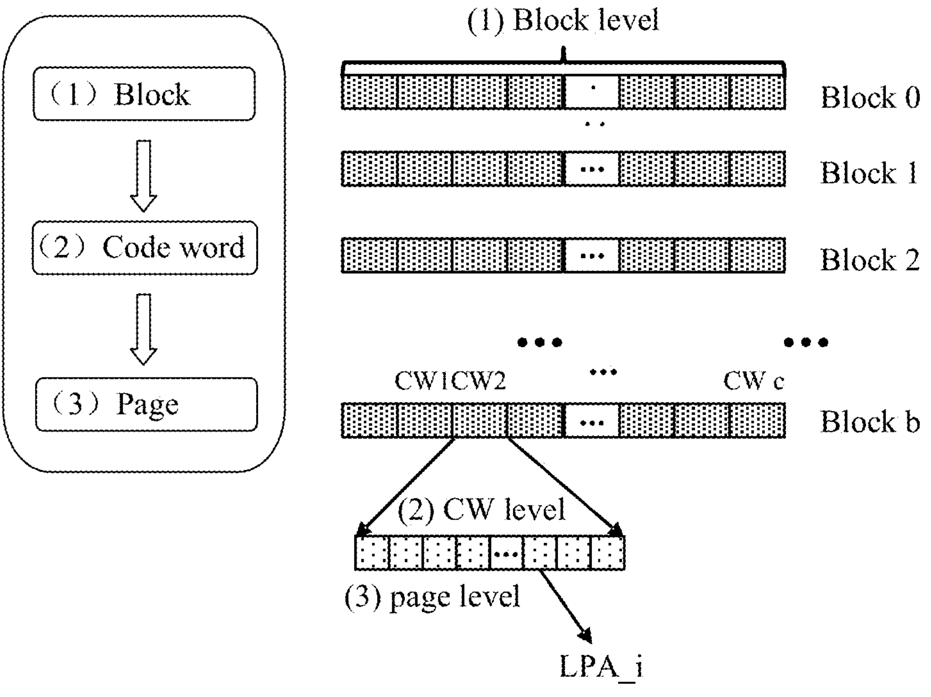
FIG. 5 is a schematic diagram of a corresponding relationship between a logic page and a logic block provided by an implementations of the present disclosure.
FIG. 6 is a schematic diagram of a corresponding relationship between an electric distance and a first preset threshold provided by an implementation of the present disclosure.
Figure 7:
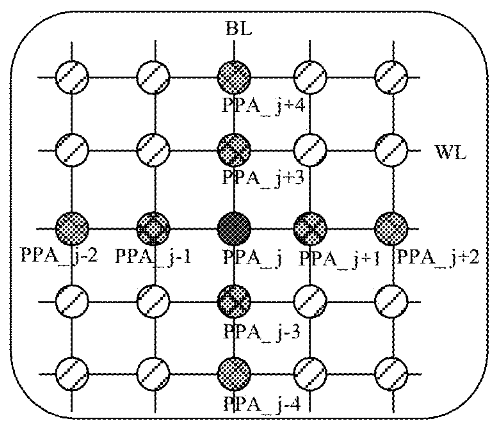
FIG. 7 is a schematic diagram of an arrangement of a target memory cell and adjacent memory cells provided by an implementation of the present disclosure.
Figure 8:
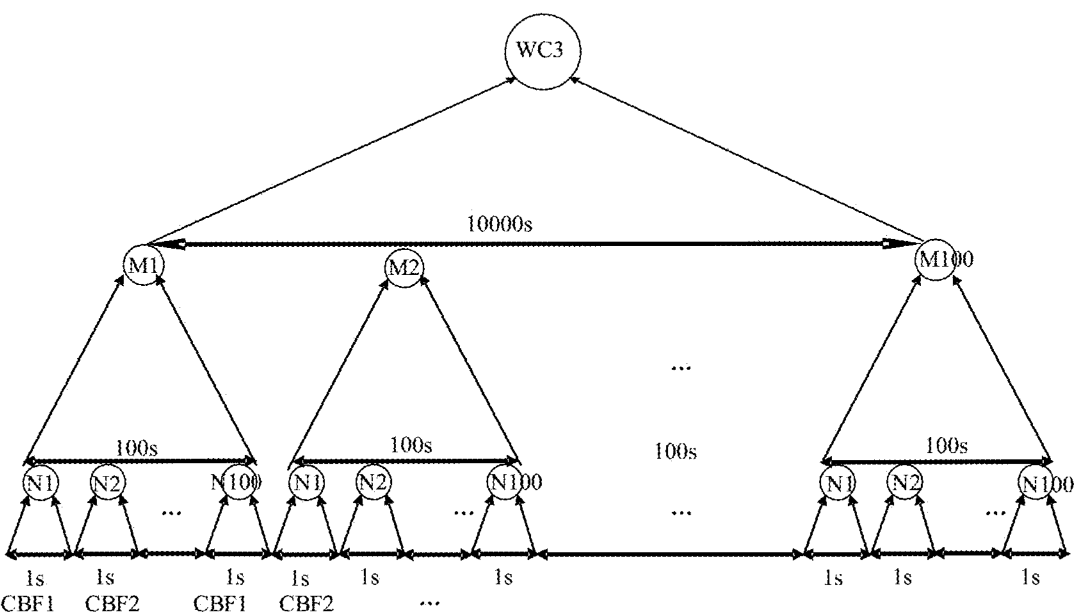
FIG. 8 is a schematic diagram of counting process by a time pyramid filter provided by an implementation of the present disclosure.
Figure 9:
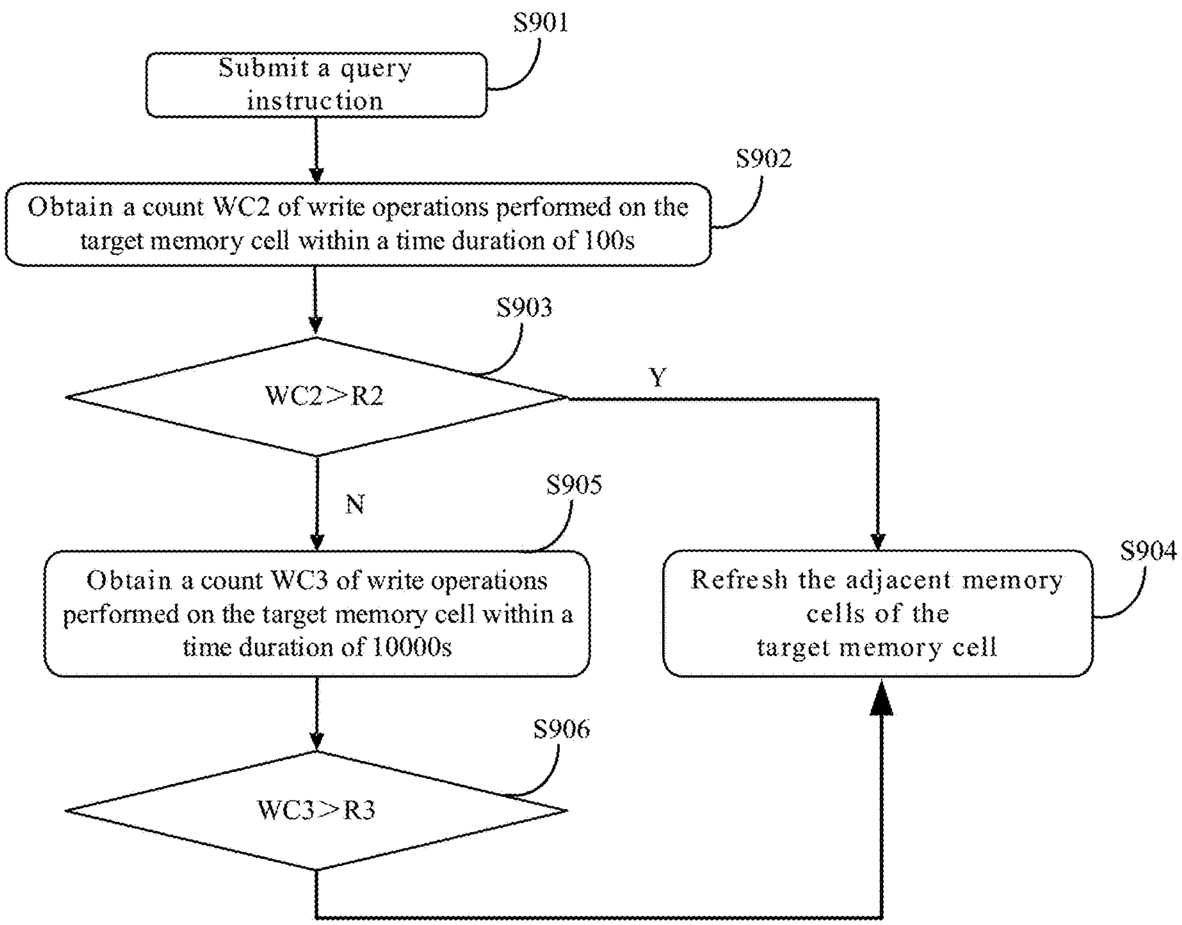
FIG. 9 is a flow diagram of counting by a Bloom filter and a time pyramid filter and determining whether to refresh adjacent memory cells provided by an implementation of the present disclosure.

How to obtain the count of write operations performed on the target memory cell within different preset time durations through a Bloom filter and a time pyramid filter and the subsequent operations are described in detail below in conjunction with FIGS. 3, 4, 5, 6, 7, 8, 9 and the implementations. FIG. 3 is a schematic diagram of counting process by a Bloom filter provided by an implementation of the present disclosure; FIG. 4 is a schematic flow diagram of counting by a Bloom filter and determining whether to refresh adjacent memory cells provided by an implementation of the present disclosure; FIG. 5 is a schematic diagram of corresponding relationship between a logic page and a logic block provided by an implementations of the present disclosure; FIG. 6 is a schematic diagram of corresponding relationship between an electric distance and a first preset threshold provided by an implementation of the present disclosure; FIG. 7 is a schematic diagram of an arrangement of a target memory cell and adjacent memory cells provided by an implementation of the present disclosure; FIG. 8 is a schematic diagram of counting process by a time pyramid filter provided by an implementation of the present disclosure; and FIG. 9 is a flow diagram of counting by a Bloom filter and a time pyramid filter and determining whether to refresh adjacent memory cells provided by an implementation of the present disclosure.

In the implementations of the present disclosure, a count of write operations performed on a target memory cell within a short period (a first preset time duration) is recorded with a Bloom filter counting; and the count of write operations performed on the target memory cell within a long period (a second preset time period, a third preset time duration) is recorded with a Bloom filter and a time pyramid filter. In other implementations, other filters may also be used for counting, which will not be described here.

As an example, referring to FIG. 3, the Bloom filter is a two counting Bloom filter in which a forward Bloom filter CBF1 stores forward data and a reverse Bloom filter CBF2 stores reverse data. When an address is written, it is written to the forward Bloom filter and the reverse Bloom filter, respectively. When it is queried whether an address exists, it needs to check both the forward Bloom filter and the reverse Bloom filter. Only when both filters determine that the address exists, the address may be determined as being existed. On this basis, when the count of writing of an address is queried, the value corresponding to a respective bit in the forward Bloom filter or the reverse Bloom filter may be checked.

Referring to FIG. 3, a host sends an instruction indicating to write data to a certain logic page of a logic block, wherein an address corresponding to the logic block included in the instruction is a logic block address (LBA) and an address corresponding to the logic page included in the instruction is a logic page address (LPA). After receiving the instruction, a buffer (such as SRAM) writes the logic page address of the target memory cell corresponding to the written data into the Bloom filter and passes through the medium complete queue.

The LBA ID shown in FIG. 3 is a logic block address (LBA) corresponding to a plurality of memory cells. The corresponding LBA ID (e.g., LBA ID3 shown in FIG. 3) is written into the forward Bloom filter CBF1 and the reverse Bloom filter CBF2 each time the write operation is performed. Specifically, LBA ID3 is used as input to calculate three hash values (H1, H2, H3) using three hash functions respectively; in the bit array of the forward Bloom filter, bits corresponding to H1, H2 and H3 are increased by 1, indicating the count of writing of LBA ID3 in the forward Bloom filter CBF1 is increased by 1. Similarly, LBA ID3 is used as input to calculate three hash values using three hash functions respectively; in the bit array of the reverse Bloom filter CBF2, bits corresponding to H1, H2 and H3 are increased by 1, indicating the count of writing of LBA ID3 in the reverse Bloom filter CBF1 is increased by 1.

Next, alternately querying for the forward Bloom filter CBF1 and the reverse Bloom filter CBF2 may be performed. The same hash function may be used to calculate the hash value. Whether the corresponding LBA ID3 exists in the forward Bloom filter CBF1 and the reverse Bloom filter CBF2 may be determined by checking whether the corresponding bit is 1. Further, the count of writing of LBA ID3 may be determined according to the value of the corresponding bit in the forward Bloom filter CBF1.

It should be noted that when the values of the three bits corresponding to H1, H2 and H3 in the bit array corresponding to the forward Bloom filter CBF1/reverse Bloom filter CBF2 are different, the smallest value in the three bits is taken as the count of writing of LBA ID3. It should be noted that the monitoring time interval of the Bloom filter shown in FIG. 3 is 1 s, that is, the first preset time duration is 1 s. In other implementations, the monitoring time interval of the Bloom filter may also be 100 ms or 10 s and the like. In some implementations, in the process of alternately querying the forward Bloom filter and the reverse Bloom filter, the previous Bloom filter may be cleared after each query so that the state of Bloom filter may be reset on the next query. In the following time points, continue to query the two Bloom filters alternately and clear the previously queried Bloom filter, to implement periodic query operations.

Referring to Operation S401 of FIG. 4, submitting an instruction to query a count of writing for the target memory cell.

Operation S402: reading a logic page address LPA of each memory cell in a non-volatile memory device.

Operation S403: periodically selecting to write the logic page address.

Operation S404: through the logic address (LPA_i) of the target memory cell, querying, on the Bloom filter, a count of write operations performed for the logic address within a preset time duration, for example, the count WC1 of write operations performed on the target memory cell within the first preset time duration. Referring to FIG. 5, a schematic diagram of corresponding relationship between a logic block address and a logic page address is shown. The non-volatile memory device includes a plurality of logic blocks (Block0 . . . . Blockb). Each logic block includes a plurality of logic pages. The logic address (LPA_i) of the target memory cell may be determined by decoding a code word corresponding to the logic block address.

Operation S405: determining a magnitude relationship between the count WC1 of write operations performed on the target memory cell within the first preset time duration and the first preset threshold R1. When the count WC1 of write operation performed within the first preset time duration is greater than the first preset threshold R1, Operation S406 is performed. When the count WC1 of write operation performed within the first preset time duration is less than or equal to the first preset threshold R1, Operation S408 is performed.

Operation S406: refreshing adjacent memory cells of the target memory cell. It should be understood that, after the logic address (LPA_i) of the target memory cell is determined, the physical address (PPA_i) of the target memory cell may be determined according to a mapping table of correspondence between the logic address and the physical address, and then the physical addresses of the adjacent memory cells of the target memory cell are PPA_i+1 and PPA_i−1, respectively. Here, only memory cells PPA_i+1 and PPA_i−1 are shown as the adjacent memory cells of the target memory cell PPA_i. The adjacent memory cells are described in detail below and will not be detailed here.

Operation S407: clearing the count of write operations performed on the target memory cell within a first preset time in the Bloom filter. It should be understood that periodic querying operations may be implemented by clearing the corresponding count in the Bloom filter, and interference of previous query information to subsequent queries may be avoided, while the memory occupation of the Bloom filter may also be reduced.

Operation S408: not refreshing the adjacent memory cells of the target memory cell for this moment.

Operation S409: obtaining a count of write operations performed within a longer present time duration, for example, WC2.

As mentioned above, the memory cells adjacent to the target memory cell PPA_i also include other memory cells connected to the same word line WL or bit line BL as the target memory cell. The different adjacent memory cells have different distances from the target memory cell, thus the degree of being interfered by writing is different. In view of this, different preset thresholds are set for the adjacent memory cells with different distances in the implementations of the present disclosure.

In particular, the non-volatile memory device further comprises a plurality of word lines and a plurality of bit lines; the plurality of memory cells are coupled with the plurality of word lines and the plurality of bit lines, each of the word lines and each of the bit lines is connected to an address line driver through a respective address line contact. In view of this, the operating method further comprises: determining the first preset threshold corresponding to the first preset time duration, according to a distance between the target memory cell and the address line contact of at least one of the word line or the bit line where the target memory cell is located.

Here, the distance between the target memory cell and the address line contact of at least one of the word line or the bit line where the target memory cell is located is an electric distance (ED). After the non-volatile memory device is produced, the positions of the word lines and the bit lines are fixed, so that the address line contact connecting the word line and the address line contact connecting the bit line are also fixed. Thus the electric distance between the target memory cell and the address line contact of the word line and the address line contact of the bit line is also fixed. In view of this, the values of the first preset threshold corresponding to the first preset time duration may be determined as being different according to different electric distances.

In some implementations, the first preset threshold is determined to be a first value when the distance between the target memory cell and the address line contact of at least one of the word line or the bit line where the target memory cell is located is a first distance; the first preset threshold is determined to be a second value when the distance between the target memory cell and the address line contact of at least one of the word line or the bit line where the target memory cell is located is a second distance; and the first preset threshold is determined to be a third value when the distance between the target memory cell and the address line contact of at least one of the word line or the bit line where the target memory cell is located is a third distance. The first distance is less than the second distance, and the second distance is less than the third distance; the first value is less than the second value, and the second value is less than the third value.

As an example, referring to FIG. 6, the first distance NN is less than the second distance MM, and the second distance MM is less than the third distance FF, i.e., NN<MM<FF. The first value may be 600, the second value may be 800, and the third value may be 1000. In other words, the value of the first preset threshold is larger when the electric distance between the target memory cell and the address line contact of at least one of the word line or the bit line where the target memory cell is located is larger.

In view of this, in some implementations, the operating method further comprises: refreshing memory cells disposed adjacent to the target memory cell along a direction in which the word lines extend and/or memory cells disposed adjacent to the target memory cell along a direction in which the bit lines extend.

For example, referring to FIG. 7, the memory cells (PPA_j−2, PPA_j−1, PPA_j+1, PPA_j+2) are disposed adjacent to the target memory cell (PPA_j) along a direction in which the word line (WL) extends, and the memory cells (PPA_j−4, PPA_j−3, PPA_j+3, PPA_j+4) are disposed adjacent to the target memory cell (PPA_j) along a direction in which the bit line (BL) extends. Different memory cells adjacent to the target memory cell may be chosen to be refreshed based on different degree of influence of write interference to adjacent memory cells.

Referring to FIGS. 3, 8 and 9, through the Bloom filter and the time pyramid filter, the count WC2 of write operations performed on the target memory cell within the second preset time duration and the count WC3 of write operations within the third preset time duration may be obtained.

As an example, with reference to FIGS. 8 and 9, Operation S901: issuing a query instruction.

Operation S902: obtaining a count WC2 of write operation performed on the target memory cell within the second preset time duration by combining a Bloom filter and a time pyramid filter. For example, the second preset time duration may be 100 s. With the Bloom filter, the forward Bloom Filter CBF1 and the reverse Bloom Filter CBF2 are each alternately queried for 50 times. The count of writing for each query is obtained, such as N1, N2 . . . . N100. The value of the 100 queries are summed up to obtain the count WC2 of write operations performed on the target memory cell within 100 s.

Operation S903: each time the second preset time duration is reached, comparing the obtained count WC2 of write operations performed on the target memory cell with the second preset threshold for one time, to determine whether the count WC2 of write operations performed on the target memory cell is greater than the second preset threshold.

When the count WC2 of write operations performed on the target memory cell is greater than the second preset threshold, Operation S904 is performed to refresh the adjacent memory cells of the target memory cell.

When the count WC2 of write operations performed on the target memory cell is less than the second preset threshold, Operation S905 is performed to obtain the count WC3 of write operations performed on the target memory cell within the third preset time duration. For example, the third preset time duration may be 10,000 s. With the time pyramid filter, the count of write operations within each 100 s is obtained for 100 times, for example, M1, M2 . . . . M100. The count of writing for the 100 times are summed up to obtain the count WC3 of write operations performed on the target memory cell within 10,000 s.

Operation S906: each time the third preset time duration is reached, comparing the obtained count WC3 of write operations performed on the target memory cell with the third preset threshold, to determine whether the count WC3 of write operations performed on the target memory cell is greater than the third preset threshold. When the count WC3 of write operations performed on the target memory cell is greater than the third preset threshold, Operation S904 is performed to refresh the adjacent memory cells of the target memory cell.

In view of this, the count of writing for the target memory cell is monitored in long term or short term by the Bloom filter and/or the time pyramid filter. When the count of writing within a certain preset time duration (long term or short term) is greater than a certain corresponding preset threshold, the adjacent memory cells of the target memory cell may be refreshed. In such a way, the write interference to the adjacent memory cells of the target memory cell caused by the write operation performed frequently may be reduced. Moreover, access performance of the memory system may be improved by monitoring the count of writing for the target memory cell and filtering out the memory cells damaged by frequent writing and reading during refreshing the adjacent memory cells.

Based on above operating method, the implementations of the present disclosure further provides a memory system, comprising: a non-volatile memory device including a plurality of memory blocks which include a plurality of memory cells, the plurality of memory cells comprises a first memory cell; and a memory controller coupled to the non-volatile memory device and configured to: refresh adjacent memory cells of the first memory cell, when a count of write operations performed on the first memory cell within a preset time duration is greater than a preset threshold.

In some implementations, the memory controller is configured to: obtain a count of write operations performed on the first memory cell within the preset time duration and the preset threshold; wherein different preset time durations correspond to different preset thresholds.

In some implementations, the memory controller is further configured to: refresh the adjacent memory cells of the first memory cell, when the count of write operations performed on the first memory cell within the first preset time duration is greater than the first preset threshold; refresh the adjacent memory cells of the first memory cell, when the count of write operations performed on the first memory cell within the second preset time duration is greater than the second preset threshold; the first preset time duration is shorter than the second preset time duration; a ratio between the first preset threshold and the first preset time duration is a first ratio, a ratio between the second preset threshold and the second preset time duration is a second ratio, and the first ratio is greater than the second ratio.

In some implementations, the memory controller is further configured to: obtain the count of write operations performed on the first memory cell within the second preset time duration and the second preset threshold, when the count of write operations performed on the first memory cell within the first preset time duration is less than or equal to the first preset threshold; and refresh the adjacent memory cells of the first memory cell, when the count of write operations performed on the first memory cell within the second preset time duration is greater than the second preset threshold.

In some implementations, the memory controller is further configured to: obtain the count of write operations performed on the first memory cell within the third preset time duration and the third preset threshold, when the count of write operations performed on the first memory cell within the second preset time duration is less than or equal to the second preset threshold; the second preset time duration is shorter than the third preset time duration; a ratio between the third preset threshold and the third preset time duration is a third ratio, and the second ratio is greater than the third ratio; refresh the adjacent memory cells of the first memory cell, when the count of write operations performed on the first memory cell within the third preset time duration is greater than the third preset threshold.

In some implementations, the memory blocks further comprise a plurality of word lines and a plurality of bit lines; the plurality of memory cells are coupled with the plurality of word lines and the plurality of bit lines, each of the word lines and each of the bit lines is connected to an address line driver through a respective address line contact; the memory controller is further configured to: determine the first preset threshold corresponding to the first preset time duration, according to a distance between the first memory cell and the address line contact of at least one of the word line or the bit line where the first memory cell is located.

In some implementations, the memory controller is configured to: determine the first preset threshold to be a first value when the distance between the first memory cell and the address line contact of at least one of the word line or the bit line where the first memory cell is located is a first distance; determine the first preset threshold to be a second value when the distance between the first memory cell and the address line contact of at least one of the word line or the bit line where the first memory cell is located is a second distance; determine the first preset threshold to be a third value when the distance between the first memory cell and the address line contact of at least one of the word line or the bit line where the first memory cell is located is a third distance; the first distance is less than the second distance, and the second distance is less than the third distance; the first value is less than the second value, and the second value is less than the third value.

In some implementations, the memory controller is further configured to: obtain the count of write operations performed on the first memory cell within the preset time duration through a Bloom filter and/or a time pyramid filter.

In some implementations, the memory controller is further configured to: clear the count of write operations performed on the first memory cell within the preset time duration after refreshing the adjacent memory cells of the first memory cell.

In some implementations, the memory blocks comprise a plurality of word lines and a plurality of bit lines; the plurality of memory cells are coupled with the plurality of word lines and the plurality of bit lines; the memory controller is further configured to: refresh memory cells disposed adjacent to the first memory cell along a direction in which the word lines extend and/or memory cells disposed adjacent to the first memory cell along a direction in which the bit lines extend.

In some implementations, the memory system comprises a storage level memory system and the non-volatile memory device comprises a phase change memory.

The implementations of the present disclosure further provides an electronic device comprising a host system and a memory system coupled to the host system, wherein: the memory system includes a non-volatile memory device and a memory controller coupled to the non-volatile memory device; the non-volatile memory device includes a plurality of memory blocks including a plurality of memory cells, the plurality of memory cells including a first memory cell; the host system is configured to store a count of write operations performed on the first memory cell in a filter of the host system during performing the write operations on the first memory cell; the memory controller is configured to: obtain, from the filter, a count of write operations performed on the first memory cell within a preset time duration, and compare the count of write operations with a preset threshold; refresh memory cells adjacent to the first memory cell when the count of write operations is greater than the preset threshold.

The implementations of the present disclosure further provide a storage medium having executable instructions stored thereon, which when executed by a memory controller, implement the operations of the operating method of the above implementations.

In some specific implementations, the storage medium may be a magnetic random access memory, a read only memory, a programmable read-only memory, an erasable programmable read-only memory, an electrically erasable programmable read-only memory, a flash memory, a magnetic surface memory, optical disc, or a compact disc read-only memory, or various devices including one or any combination of the above memory devices.

In some implementations, the executable instructions may be written in any form of programming language (including compiling or interpreting languages or declarative or procedural languages) in the form of program, software, software module, scripts or code, and may be deployed in any form including being deployed as a stand-alone program or as module, component, subroutines or other units suitable for use in computation environment.

As an example, the executable instructions may, but do not necessarily, correspond to files in the file system, and may be stored in a portion of a file holding other programs or data, such as in one or more scripts in an HTML (hyper text markup language) document, in a single file dedicated to the program in question, or in multiple collaborative files (such as files storing one or more module, subroutines or code portions).

It should be understood that references to "one implementation" or "an implementation" throughout the specification mean that particular features, structures or characteristics related to the implementations are included in at least one implementation of the present disclosure. Thus, the phrases "in one implementation" or "in an implementation" appearing throughout the specification do not necessarily refer to the same implementation. In addition, these particular features, structures or characteristics may be combined in any arbitrary way in one or more implementations. It should be understood that in various implementations of the present disclosure, the sequence numbers of the above-mentioned processes do not mean that the sequence of execution, and the sequence of execution should be determined by their functions and inherent logic and should not constitute any limitation on the implementation of the implementations of the present disclosure. The above serial number of implementations of that present disclosure are for description only and do not represent the advantages and disadvantages of the implementation.

The method disclosed in several method implementations provided in the present disclosure may be arbitrarily combined without conflict to get new method implementations. The foregoing are only implementations of the present disclosure, but the scope of the present disclosure is not limited thereto. Any variation or permutation readily contemplated by those skilled in the art within the scope of the present disclosure should be covered within the scope of the present disclosure. Therefore, the scope of the present disclosure should be ascertained by the scope of the claims.

What is claimed is:

1. A memory system comprising:

a non-volatile memory device comprising a plurality of memory cells, wherein the plurality of memory cells comprise a target memory cell; and a memory controller coupled to the non-volatile memory device, wherein the memory controller is configured to:

in response to determining that a count of write operations performed on the target memory cell within a preset time duration is greater than a preset threshold, refresh adjacent memory cells of the target memory cell, wherein the preset threshold corresponds to the preset time duration.

2. The memory system of claim 1, wherein the memory controller is configured to:

obtain the count of write operations performed on the target memory cell within the preset time duration and the preset threshold, wherein different preset time durations correspond to different preset thresholds.

3. The memory system of claim 2, wherein a first preset time duration corresponds to a first preset threshold, a second preset time duration corresponds to a second preset threshold, and the second preset time duration is longer than the first preset time duration, wherein a ratio between the first preset threshold and the first preset time duration is a first ratio, a ratio between the second preset threshold and the second preset time duration is a second ratio, and the first ratio is greater than the second ratio, and wherein the memory controller is configured to:

in response to determining that a first count of write operations performed on the target memory cell within the first preset time duration is greater than the first preset threshold, refresh the adjacent memory cells of the target memory cell, in response to determining that the first count of write operations performed on the target memory cell within the first preset time duration is less than or equal to the first preset threshold, obtain a second count of write operations performed on the target memory cell within the second preset time duration and the second preset threshold, and in response to determining that the second count of write operations performed on the target memory cell within the second preset time duration is greater than the second preset threshold, refresh the adjacent memory cells of the target memory cell.

4. The memory system of claim 3, wherein a third preset time duration corresponds to a third preset threshold, and the third preset time duration is longer than the second preset time duration, a ratio between the third preset threshold and the third preset time duration is a third ratio, and the second ratio is greater than the third ratio, and wherein the memory controller is configured to:

in response to determining that the second count of write operations performed on the target memory cell within the second preset time duration is less than or equal to the second preset threshold, obtain a third count of write operations performed on the target memory cell within the third preset time duration and the third preset threshold, and in response to determining that the third count of write operations performed on the target memory cell within the third preset time duration is greater than the third preset threshold, refresh the adjacent memory cells of the target memory cell.

5. The memory system of claim 2, wherein the non-volatile memory device further comprises a plurality of word lines and a plurality of bit lines, wherein the plurality of memory cells are coupled with the plurality of word lines and the plurality of bit lines, and each of the plurality of word lines and the plurality of bit lines is connected to an address line driver through a respective address line contact, and wherein the memory controller is further configured to:

determine the preset threshold corresponding to the preset time duration, according to a distance between the target memory cell and an address line contact corresponding to at least one of a word line or a bit line where the target memory cell is located.

6. The memory system of claim 5, wherein the memory controller is configured to:

determine the preset threshold to be a first value, if the distance between the target memory cell and the address line contact corresponding to the at least one of the word line or the bit line where the target memory cell is located is a first distance;

determine the preset threshold to be a second value, if the distance between the target memory cell and the address line contact corresponding to the at least one of the word line or the bit line where the target memory cell is located is a second distance; and determine the preset threshold to be a third value, if the distance between the target memory cell and the address line contact corresponding to the at least one of the word line or the bit line where the target memory cell is located is a third distance, wherein the first distance is less than the second distance, and the second distance is less than the third distance, and wherein the first value is less than the second value, and the second value is less than the third value.

7. The memory system of claim 2, wherein the memory controller is further configured to:

obtain the count of write operations performed on the target memory cell within the preset time duration through at least one of a Bloom filter or a time pyramid filter.

8. The memory system of claim 1, wherein the memory controller is further configured to:

clear the count of write operations performed on the target memory cell within the preset time duration after refreshing the adjacent memory cells of the target memory cell.

9. The memory system of claim 1, wherein the non-volatile memory device further comprises a plurality of word lines and a plurality of bit lines, and the plurality of memory cells are coupled with the plurality of word lines and the plurality of bit lines, and wherein the memory controller is further configured to perform at least one of:

refreshing memory cells disposed adjacent to the target memory cell along a direction in which the plurality of word lines extend, or refreshing memory cells disposed adjacent to the target memory cell along a direction in which the plurality of bit lines extend.

10. The memory system of claim 1, wherein the memory system comprises a storage level memory system and the non-volatile memory device comprises a phase change memory.

11. An electronic device comprising:

a host system; and a memory system coupled to the host system, wherein the memory system comprises a non-volatile memory device and a memory controller coupled to the non-volatile memory device, and the non-volatile memory device comprises a plurality of memory cells that comprises a target memory cell, wherein the host system is configured to:

store a count of write operations performed on the target memory cell in a filter of the host system during performing the write operations on the target memory cell, and wherein the memory controller is configured to:

obtain, from the filter, the count of write operations performed on the target memory cell within a preset time duration, and compare the count of write operations with a preset threshold, wherein the preset threshold corresponds to the preset time duration; and in response to determining that the count of write operations is greater than the preset threshold, refresh adjacent memory cells of the target memory cell.

12. An operating method for a memory system comprising a non-volatile memory device and a memory controller coupled with the non-volatile memory device, the operating method comprising:

comparing a count of write operations performed on a target memory cell of a plurality of memory cells of the non-volatile memory device within a preset time duration with a preset threshold, wherein the preset threshold corresponds to the preset time duration; and in response to determining that the count of write operations performed on the target memory cell within a preset time duration is greater than the preset threshold, refreshing adjacent memory cells of the target memory cell.

13. The operating method of claim 12, further comprising:

obtaining the count of write operations performed on the target memory cell within the preset time duration and the preset threshold, wherein different preset time durations correspond to different preset thresholds.

14. The operating method of claim 13, wherein a first preset time duration corresponds to a first preset threshold, a second preset time duration corresponds to a second preset threshold, and the second preset time duration is longer than the first preset time duration, wherein a ratio between the first preset threshold and the first preset time duration is a first ratio, a ratio between the second preset threshold and the second preset time duration is a second ratio, and the first ratio is greater than the second ratio, and wherein refreshing adjacent memory cells of the target memory cell comprises:

if a first count of write operations performed on the target memory cell within the first preset time duration is greater than the first preset threshold, refreshing the adjacent memory cells of the target memory cell, and if the first count of write operations performed on the target memory cell within the first preset time duration is less than or equal to the first preset threshold, obtaining a second count of write operations performed on the target memory cell within the second preset time duration and the second preset threshold, comparing the second count of write operations performed on the target memory cell within the second preset time duration with the second preset threshold, and if the second count of write operations performed on the target memory cell within the second preset time duration is greater than the second preset threshold, refreshing the adjacent memory cells of the target memory cell.

15. The operating method of claim 14, wherein a third preset time duration corresponds to a third preset threshold, and the third preset time duration is longer than the second preset time duration, a ratio between the third preset threshold and the third preset time duration is a third ratio, and the second ratio is greater than the third ratio, wherein refreshing adjacent memory cells of the target memory cell comprises:

if the second count of write operations performed on the target memory cell within the second preset time duration is less than or equal to the second preset threshold, obtaining a third count of write operations performed on the target memory cell within the third preset time duration and the third preset threshold, comparing the third count of write operations performed on the target memory cell within the third preset time duration with the third preset threshold; and if the third count of write operations performed on the target memory cell within the third preset time duration is greater than the third preset threshold, refreshing the adjacent memory cells of the target memory cell.

16. The operating method of claim 13, wherein the non-volatile memory device further comprises a plurality of word lines and a plurality of bit lines, the plurality of memory cells are coupled with the plurality of word lines and the plurality of bit lines, and each of the word lines and the bit lines is connected to an address line driver through a respective address line contact, and wherein the operating method further comprises:

determining the preset threshold corresponding to the preset time duration, according to a distance between the target memory cell and an address line contact corresponding to at least one of a word line or a bit line where the target memory cell is located.

17. The operating method of claim 16, wherein determining the preset threshold corresponding to the preset time duration comprises:

determining the first preset threshold to be a first value, if the distance between the target memory cell and the address line contact corresponding to the at least one of the word line or the bit line where the target memory cell is located is a first distance;

determining the first preset threshold to be a second value, if the distance between the target memory cell and the address line contact of the at least one of the word line or the bit line where the target memory cell is located is a second distance; and determining the first preset threshold to be a third value, if the distance between the target memory cell and the address line contact of the at least one of the word line or the bit line where the target memory cell is located is a third distance, wherein the first distance is less than the second distance, and the second distance is less than the third distance, and wherein the first value is less than the second value, and the second value is less than the third value.

18. The operating method of claim 12, further comprising:

obtaining the count of write operations performed on the target memory cell within the preset time duration through at least one of a Bloom filter or a time pyramid filter.

19. The operating method of claim 12, further comprising:

clearing the count of write operations performed on the target memory cell within the preset time duration after refreshing the adjacent memory cells of the target memory cell.

20. The operating method of claim 12, wherein the non-volatile memory device further comprises a plurality of word lines and a plurality of bit lines, and the plurality of memory cells are coupled with the plurality of word lines and the plurality of bit lines, and wherein refreshing adjacent memory cells of the target memory cell comprises at least one of:

refreshing memory cells disposed adjacent to the target memory cell along a direction in which the plurality of word lines extend, or refreshing memory cells disposed adjacent to the target memory cell along a direction in which the plurality of bit lines extend.

* * * * *